United States Patent [19]

Smith, III

[11] Patent Number: 4,882,608
[45] Date of Patent: Nov. 21, 1989

[54] MULTILAYER SEMICONDUCTOR DEVICE HAVING MULTIPLE PATHS OF CURRENT FLOW

[75] Inventor: Theoren P. Smith, III, Yorktown Heights, N.Y.

[73] Assignee: International Business Machines Corporation, Armonk, N.Y.

[21] Appl. No.: 216,590

[22] Filed: Jul. 7, 1988

Related U.S. Application Data

[63] Continuation-in-part of Ser. No. 12,575, Feb. 9, 1987, Pat. No. 4,812,886.

[51] Int. Cl.⁴ .................................. H01L 29/80
[52] U.S. Cl. .................................. 357/22; 357/16
[58] Field of Search ............... 357/22 A, 22 E, 22 K, 357/16

[56] References Cited

U.S. PATENT DOCUMENTS

| | | |
|---|---|---|
| 4,424,525 | 1/1984 | Mimura . |
| 4,455,564 | 6/1984 | Delagebeaudeuf et al. . |
| 4,471,367 | 9/1984 | Chen et al. . |
| 4,558,337 | 12/1985 | Saunier ............................ 357/22 A |
| 4,688,061 | 8/1987 | Sakaki ............................... 357/22 A |
| 4,755,857 | 7/1988 | Abstreiter ......................... 357/22 A |
| 4,806,998 | 2/1989 | Vinter ............................... 357/22 A |

FOREIGN PATENT DOCUMENTS 59-25275  2/1984  Japan .
59-63769  4/1984  Japan .

OTHER PUBLICATIONS

Bonnefoi et al., Resonant Tunneling Transistors with Controllable Negative Differential Resistance, IEEE Electron Device Letters, vol. 6, No. 12, Dec. 1985.
N. Cirillo, et al., Self-Aligned Modulation-Doped (Al,Ga) As/GaAs Field Effect Transistors, Electron Device Letters.
R. Thorne, et al., Performance of Inverted Structure Modulation Doped Schottky Barrier Field Effect Transistors, Japanese Journal of Applied Physics, vol. 21, No. 4, Apr. 1982.
Woodward et al., Experimental Realization of a Resonant Tunneling Transistor, General Physics Advance Abstracts, vol. 3, No. 3, Feb. 1987.
S. Long et al., High Speed GaAs Integrated Circuits, IEEE Proceedings, vol. 70, No. 1, Jan. 1982.
R. Fischer et al., New High-Speed (Al,Ga) as Modulation Doped Field-Effect Transistors, IEEE Circuits and Devices Magazine, Jul. 1985.
S. Lee et al., Parasitic Source and Drain Resistance in High-Electron-Mobility Transistors, Solid-State Electronics, vol. 28, No. 7, 1985.

*Primary Examiner*—Martin H. Edlow
*Attorney, Agent, or Firm*—Scully, Scott, Murphy & Presser

[57] ABSTRACT

A multilayer semiconductor structure is disclosed having a plurality of conducting layers separated by a barrier layer. A common contact extends from an upper exposed surface to all the layers of the device and a surface contact extends from the upper surface into an uppermost conducting layer. Each of the conducting layers defines an independent channel of current flow thereby providing at least two independent current paths between the common contact and the surface contact. A Schottky barrier electrode is disposed on the surface of the structure between the common and surface contacts and is operable to selectively deplete charge carriers within the conducting layers sequentially to cause current to flow through the desired channel. The current flow in each channel results in an independent I/V characteristic curve in which one channel is linear and the other channel is non-linear.

29 Claims, 3 Drawing Sheets

MULTILAYER SEMICONDUCTOR DEVICE HAVING MULTIPLE PATHS OF CURRENT FLOW

This application is a continuation-in-part application of U.S. application Ser. No. 012,575, filed Feb. 9, 1987, now U.S. Pat. No. 4,812,886.

BACKGROUND OF THE INVENTION

This invention relates to multilayer semiconductor devices and, in particular, to multilayer semiconductor devices with a common contact to a plurality of conducting layers providing two or more paths of current flow.

Semiconductor devices, such as transistors, can consist of multiple layers of semiconducting or insulating materials. In a vertical transistor there are at least three layers including an emitter, base and collector. Charge carriers, either holes or electrons or both, pass from the emitter, through the base, to the collector. A metallic contact is deposited on each of the layers for operating the transistor.

Horizontal or field effect transistors are also multilayer devices. The source, gate and drain each have a metallic contact. The gate may include a Schottky barrier that creates a depletion layer to control the transfer of charges that flow underneath the gate from the source to the drain.

Recent developments in semiconductors have produced multilayer heterojunction devices. These devices, either vertical or horizontal transistors, are typically fashioned from alternate layers of gallium arsenide (GaAs) and aluminum gallium arsenide (AlGaAs). Under voltages suitably applied to such a device, a thin, high mobility region can be formed at the junction of such materials. This region, in a horizontal transistor, is termed a two dimensional electron gas or 2 DEG. Electrons that make up a 2 DEG have a very high mobility. Such high mobility gives such transistors a switching speed almost four-times as fast as other transistors.

In horizontal high mobility devices, such as field effect transistors, it is known to place a source and drain contact on a common upper surface. A Schottky barrier, as a gate, is positioned between the source and drain and on the upper surface. The gate controls the flow of charges in the 2 DEG between the source and drain by depleting the 2 DEG beneath the gate electrode. See, for example, U.S. Pat. Nos. 4,558,337; 4,471,367 and 4,455,564. In these devices, the source and drain contacts extend only to the upper conducting layer.

It is desirable in some applications, e.g., oscillators, to switch the conduction path between different conducting layers. Prior art horizontal devices are known having a pair of contacts common to several conducting layers of the device. A Schottky barrier is provided to sequentially deplete the conducting layers. However, current flows through all undepleted layers and there is no means for switching the flow of current between two or more layers.

Vertical high mobility devices are more difficult to fabricate. They comprise very thin layers that have to be precisely deposited or etched to expose lower layers for forming ohmic contacts. Two hundred angstroms is typical of the thickness of some layers. Molecular beam epitaxial deposition equipment can deposit such thin layers. However, it is difficult to fix metal contacts on devices with such thin layers. Therefore, a simple contact scheme is needed for devices having vertical transport.

SUMMARY OF THE INVENTION

The present invention is directed to a multilayer semiconductor structure that permits current to selectively pass through different layers of the device. The structure includes a plurality of superimposed layers of semiconductor material disposed on a substrate essentially parallel to an exposed surface. At least two of the layers contain charge carriers and are therefore conducting layers. The two or more conducting layers are separated from each other by a barrier region. A first contact extends from the exposed surface through the plurality of layers to electrically contact each of the conducting layers, and hence, is a single common contact to all the conducting layers of the device. A second or surface contact is separated from the first contact and extends from the exposed surface to electrically contact the uppermost conducting layer. Each of the conducting layers defines an independent channel of current flow thereby providing at least two independent current paths between the common contact and the surface contact. A carrier depletion control means is disposed on the exposed surface between the common and surface contacts and is operable to deplete charge carriers within the conducting layers sequentially. The carrier depletion control means is thereby utilized to cause current to flow between the common and surface contacts through the channels selectively. In addition, the carrier depletion control means may prevent all current flow between the first and second contacts.

The carrier depletion control means may be in the form of a Schottky barrier electrode deposited on the surface of the device. A bias voltage may be applied to the control means to sequentially deplete the charge carriers in each of the channels. In an illustrative embodiment, with no bias voltage applied to the Schottky electrode, the current will flow between the common and surface contacts through the uppermost conducting channel. The current will naturally flow through this uppermost conducting channel because of the additional resistance presented by the barrier region separating the lower conducting channels from the surface contact. Any current flowing through the lower conducting channels would have to pass through each of the barrier regions to reach the surface contact and, since current flows through the path of least resistance, current will necessarily flow along the highest undepleted conducting layer. A bias voltage may then be applied to the Schottky electrode sufficient to deplete the charge carriers in the upper conducting layer beneath the electrode resulting in current flow being blocked in the upper layer. Current will then necessarily flow along the next highest undepleted conducting channel and then through the barrier to the surface contact. Upon depleting all the conducting layers, the flow of current between the common and surface contacts would be completely blocked.

The current paths are provided such that the current versus voltage (I/V) characteristic is different for each path. In one illustrative embodiment, the upper conducting channel comprises GaAs and a lower conducting channel comprises a two dimensional electron gas (2 DEG) in a GaAs layer. A layer of AlGaAs provides the barrier region between the two channels. A modulation doped AlGaAs layer is provided beneath the 2 DEG and the multilayers are deposited on a semi-insulating GaAs substrate. The first path of current flow between the common and surface contacts is along the upper GaAs layer. The first path has a linear I/V characteristic. The second path of current flow is along the 2 DEG layer and then through the AlGaAs barrier layer. The second path has a non-linear characteristic due to negative resistance resulting from tunneling of electrons out of the quantum states of the 2 DEG through the barrier and into the upper conducting layer. Such a device would be useful as an oscillator, wherein current could be turned on and off and also be switched between two different I/V characteristics. Current could be shut off completely by providing a suitable bias voltage on the Schottky electrode to deplete all the charge carriers in each of the channels.

Thus, the present invention provides two or more separate conduction paths through two or more vertically separate conducting layers without the need for physically removing material from the upper layers to expose a lower layer for receiving a metallic contact. Electrical contact to various layers is controlled even though the layers are as thin as 200 angstroms. Such a technique could be used to further reduce the overall dimensions of the device since thin layers of 200 angstroms or less can be used as a barrier layer for separating the conducting channels. The invention could further the development of a three-dimensional or stacked microprocessor since interlayer metallic contact is feasible.

DETAILED DESCRIPTION OF THE INVENTION

Figure 1A:
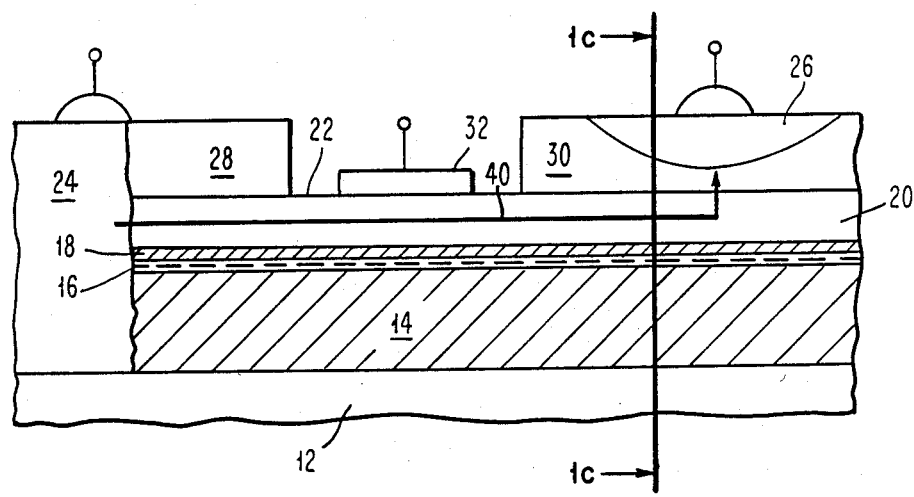
FIGS. 1a and 1b are cross-sectional views of one embodiment of the invention having two conduction channels.
Figure 1B:
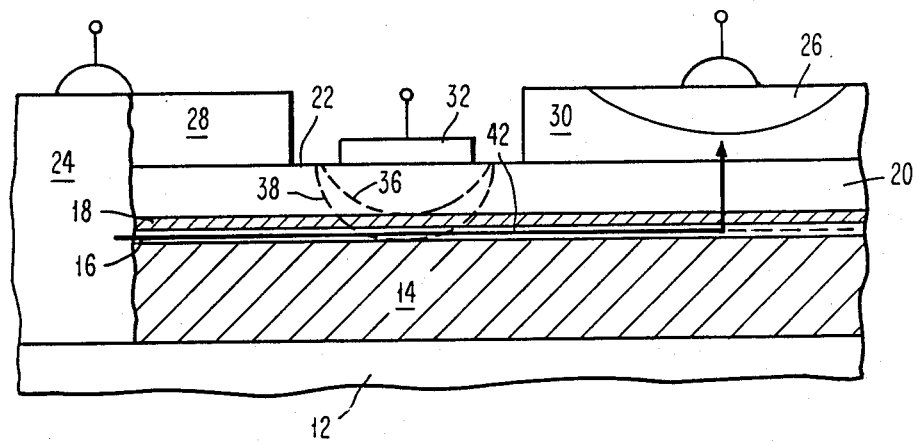

The device 10 of FIGS. 1a and 1b includes a semi-insulating substrate 12 and a modulation doped AlGaAs layer 14 disposed thereon. An undoped layer 16 of GaAs is disposed on layer 14 and a barrier layer 18 of undoped AlGaAs is disposed on layer 16. A doped layer 20 of GaAs having exposed surface 22 is disposed on layer 18. A first contact 24 is deposited to extend from the upper surface 22 through all the layers of the device 10. A second contact 26 is deposited to be in electrical contact with upper layer 20. As shown in FIGS. 1a and 1b, doped layers 28 and 30 may be deposited on surface 22 as contact layers to reduce contact resistance.

In one illustrative embodiment of the invention, electrodes 28 and 30 are formed of n+ doped GaAs. Electrodes 28 and 30 are approximately 2000 angstroms thick and have a doping of $5 \times 10^{18}/cm^3$. Layer 20 is an upper conducting channel of approximately 1000 angstroms of GaAs doped n− in the order of $1 \times 10^{17}/cm^3$. The barrier layer 18 is approximately 200 angstroms of AlGaAs. Layer 16 is an undoped layer of GaAs of approximately 200 angstroms and is the second conducting layer of the device 10. In the illustrative embodiment of FIGS. 1a and 1b, layer 16 is shown as an undoped GaAs layer. Layer 14 is a 2000 angstrom layer of modulation doped AlGaAs. Due to the alignment of the conduction bands of GaAs and AlGaAs at the heterojunction between layers 14 and 16, a high mobility 2 DEG is formed in layer 16. The AlGaAs barrier layer 18 may be between 20 and 200 angstroms thick and must have a conduction band energy larger than conducting channels. In addition, a 50-400 angstrom AlGaAs spacer layer may be included in layer 14, with layer 14 being between 200 and 2000 angstroms thick in total. A further layer of over 1000 angstroms of graded $Al_xGa_{1-x}As$, where x is in the range between 0 and 0.4, may be provided between layers 14 and 12.

Figure 1C:
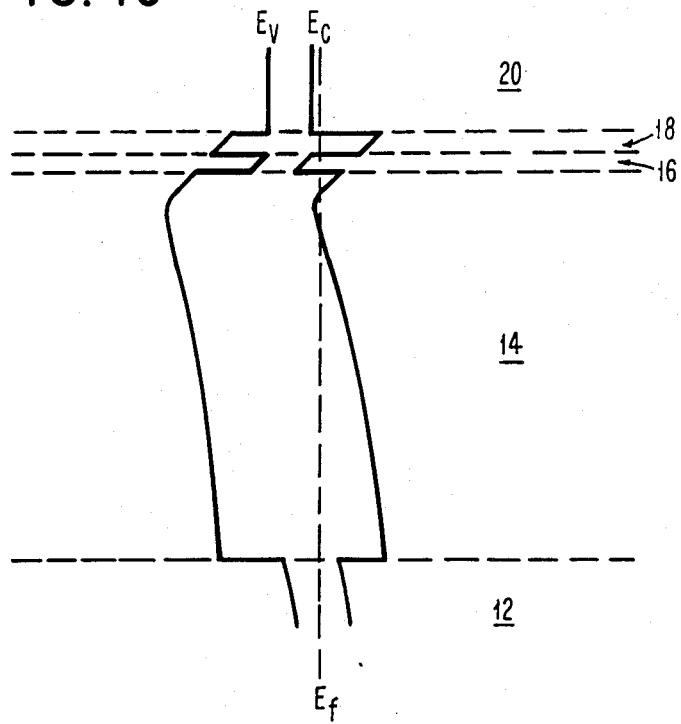
FIG. 1c is an energy band diagram of the device of FIGS. 1a and 1b taken along line c—c.

FIG. 1(c) is an energy band diagram taken along the line C—C of FIG. 1(a). As can be seen in FIG. 1(c), the conduction band energy of layer 18 is much larger than layers 16 and 20. While the device 10 is not shown to scale in FIGS. 1(a) and 1(b), the band diagram is generally to scale in which layer 18 is between 20–200 angstroms and layer 14 is approximately 2000 angstroms.

The second conducting layer 16 could also be any other conducting layer such as a heavily doped layer of GaAs. In this embodiment, layer 14 could be omitted or replaced by an undoped AlGaAs layer.

Depletion control means 32 is deposited on upper surface 22 between contacts 24 and 26. Upon the application of a suitable bias voltage to the control means 32, charge carriers are depleted sequentially through the layers of the device 10 beginning with layer 20. As shown in FIG. 1b, upon the application of a suitable bias voltage above a first threshold voltage, a depletion region 34 is formed having a boundary 36 that extends through layer 20 to layer 18. Upon the application of a second suitable bias voltage above a second threshold higher than the first threshold voltage, depletion region 34 extends all the way through to the layer 14 having a boundary 38. The depletion control means may comprise a Schottky barrier electrode or other suitable electrode adapted to deplete the charge carriers in the underlying layers upon the application of a bias voltage.

The conducting layers 16 and 20 define independent channels for current flow that provide independent current paths between contacts 24 and 26. By selectively controlling the bias voltages applied to electrode 32, the current flow may be switched between layer 20 and layer 16. As shown in FIG. 1a, current path 40 is through layer 20 and will be the path for current flow when a bias voltage below a predetermined threshold voltage is applied to electrode 32. Upon the application of a bias voltage above the threshold voltage, the depletion region 34 is generated having a boundary 36 as shown in FIG. 1b that extends to layer 18. This will block the flow of current through layer 20 between contacts 24 to 26. Current will then be forced to flow between contacts 24 and 26 along layer 16 as shown by current path 42 in FIG. 1b. Current must flow through barrier layer 18 and layer 20 beneath layer 30 to complete current path 42 between contacts 24 and 26. Current path 42 has a higher resistance due to the barrier layer 18. This higher resistance in the current path effectively prevents current from flowing through that path when the bias voltage on electrode 32 is below the predetermined threshold voltage. In addition, upon the application of a bias voltage to electrode 32 above a second threshold voltage higher than the first threshold voltage, depletion region 34 will have boundary region 38 that extends to layer 14, thereby completely shutting off the flow of current between contacts 24 and 26. Thus, the device 10 has common contact 24 that is selectively connectable to contact 26 along either flow path 40 or 42.

Figure 2:
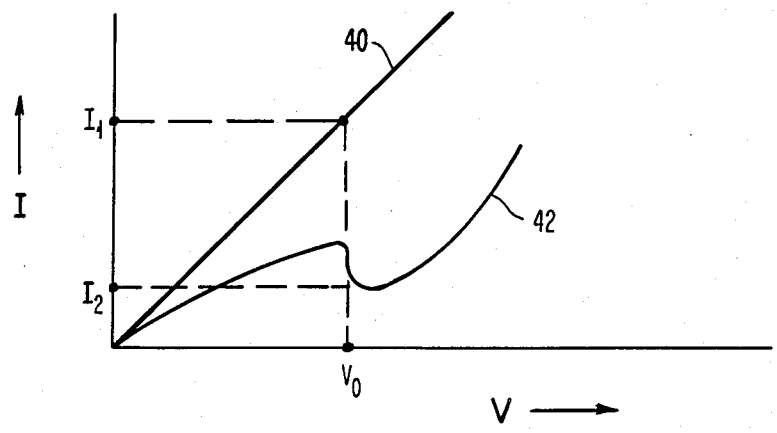
FIG. 2 is a graph of the voltage versus current characteristics of the device of FIGS. 1a and 1b.

The independent paths of current flow each have an independent I/V characteristic curve. Barrier layer 18 is designed to give the desired I/V characteristics for the current flow along path 42 which is different than the I/V characteristics for the current flow along path 40. Typically, the current flow along path 40 will have a linear relationship as shown in FIG. 2. The current flow along path 42 which is along the 2 DEG and throught the barrier layer has a negative resistance characteristic as shown in FIG. 2. Such a dual characteristic device is useful as an amplifier or an oscillator, since it has two discrete values ($I_1, I_2$) as a function of the bias voltage on electrode 32 for a given voltage ($V_0$). As shown in FIG. 2, the I/V characteristics for path 42 is non-linear. Thus, the present invention provides a single device having two independent paths for current flow where one is linear and one is non-linear and a means for switching between the two current paths.

Figure 3:
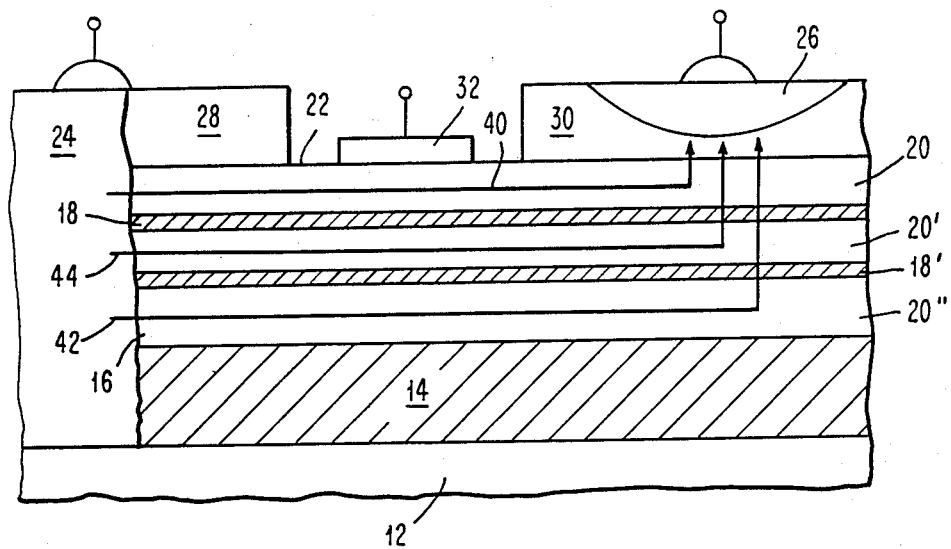
FIG. 3 is a cross-sectional view of another embodiment of the invention having three conduction channels.

An alternative embodiment is shown in FIG. 3 having 3 conduction paths 40, 42 and 44. The device 50 of FIG. 3 is shown with like numerals indicating like parts to FIGS. 1a and 1b. Device 50 includes 3 conducting channels 20, 20' and 20", each comprising doped GaAs. Conduction path 40 is a direct ohmic channel. Conduction path 42 includes tunneling through a single barrier and conduction path 44 entails double-barrier tunneling. Barrier layers 18 and 18' of undoped AlGaAs separate the conducting layers. Layer 20" may alternatively be a 2 DEG wherein layer 14 would be modulation doped AlGaAs. Layer 14 could be undoped AlGaAs or eliminated if layer 20" is a doped GaAs layer. Bias voltages applied to electrode 32 would sequentially deplete the conducting layers to selectively control the flow of current between contacts 24 and 26 through one of the three paths.

Figure 4:
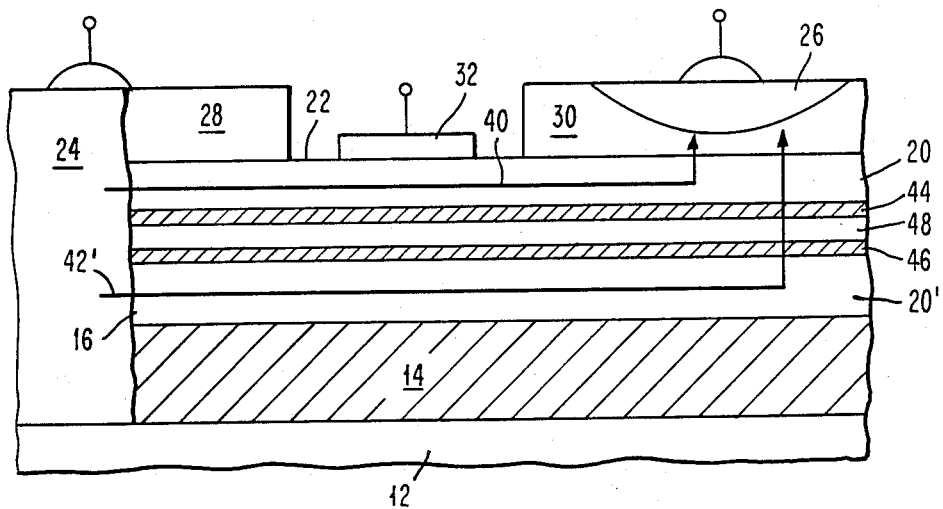
FIG. 4 is a cross-sectional view of another embodiment of the invention having a multilayer barrier region between the conducting channels.

Another embodiment of the invention is shown in FIG. 4, which also includes like numerals indicating like parts, in which the barrier region separating conducting channels 20 and 20' of doped GaAs, is a multilayer region comprising layers 44 and 46 of undoped AlGaAs and layer 48 of undoped GaAs separating layers 44 and 46. The multilayer barrier region provides a higher peak-to-valley ratio in the non-linear characteristic curve in path 42' which, for most oscillator applications, would be desirable. The embodiment of FIG. 4 may also be provided wherein the lower conducting layer is a 2 DEG and a modulation doped AlGaAs layer is provided beneath the 2 DEG layer.

Other embodiments of the device include the barrier layer comprising undoped AlAs separating conducting layers of doped GaAs. The negative differential resistance necessary for the non-linear I/V characteristic has been found to be provided by a AlAs single barrier structure due to the presence of confined X-states in the AlAs. In the embodiments having the 2 DEG, the necessary quantum states to provide the negative resistance are in the 2 DEG layer. In embodiments without the 2 DEG, the quantum states for the negative resistance must be provided in the barrier layer. The negative resistance may also be found in a single barrier structure of HgCdTe-CdTe-HgCdTe and also in a structure comprising InAs-GaAlSb-InAs.

While the invention has been particularly shown and described with respect to preferred embodiments thereof, it will be understood by those skilled in the art that the foregoing and other changes in form and detail may be made therein without departing from the spirit and scope of the invention which should be limited only by the scope of the appended claims.

What is claimed is:

1. A multilayer semiconductor structure comprising:
   a plurality of superimposed layers of semiconductor material disposed on a substrate essentially parallel to an exposed surface, at least two of said layers being conducting layers containing charge carriers, each of said at least two conducting layers being separated by a barrier region;
   a first contact extending from said exposed surface through said plurality of layers to electrically contact each of said at least two conducting layers, a second contact separated from said first contact and extending from said exposed surface to electrically contact an uppermost of said at least two conducting layers, each of said at least two conducting layers defining an independent channel of current flow thereby providing at least two independent current paths between said first and second contacts; and
   a carrier depletion control means disposed on said exposed surface between said first and second contacts and operable to selectively deplete charge carriers in the said at least two conducting layers sequentially.

2. The multilayer semiconductor structure of claim 1 wherein said carrier depletion control means includes an electrode adapted to receive a bias voltage.

3. The multilayer semiconductor structure of claim 2 wherein said electrode includes a Schottky barrier.

4. The multilayer semiconductor structure of claim 1 wherein at least said uppermost conducting layer comprises a doped compound semiconductor.

5. The multilayer semiconductor structure of claim 4 wherein at least one conducting layer other than said uppermost layer contains a 2 DEG layer.

6. The multilayer semiconductor structure of claim 5 wherein the at least one 2 DEG layer is contained within an undoped compound semiconductor.

7. The multilayer semiconductor structure of claim 1 wherein said barrier region comprises at least one layer of semiconductor having a conduction band energy larger than the conduction band energy of the at least two conducting layers.

8. The multilayer semiconductor structure of claim 1 wherein said first and second contacts are ohmic contacts.

9. The multilayer semiconductor structure of claim 8 wherein said ohmic contacts are metallic alloy contacts.

10. A multilayer semiconductor structure comprising:
   A plurality of superimposed layers of semiconductor material disposed on a substrate essentially parallel to an exposed surface, at least two of said layers containing charge carriers, each of said conducting layers being separated by a barrier region;
   a first contact extending from said exposed surface through said plurality of layers to electrically contact each of said at least two conducting layers, a second contact separated from said first contact and extending from said exposed surface to electrically cally contact an uppermost of said at least two conducting layers, each of said at least two conducting layers defining an independent channel of current flow thereby providing at least two independent current paths between said first and second contacts, each of said channels having an independent I/V characteristic curve; and means for selectively switching the flow of current between said independent current paths and completely blocking current flow between said first and second contacts.

11. The multilayer semiconductor structure of claim 10 wherein the I/V characteristic curve of at least one of said paths has a negative differential resistance.

12. The multilayer semiconductor structure of claim 11 wherein said at least two conducting layers includes said uppermost layer and a lower 2 DEG layer, said uppermost layer comprising doped GaAs and said 2 DEG layer contained within an undoped GaAs layer.

13. The multilayer semiconductor structure of claim 12 wherein said barrier region includes a layer of undoped AlGaAs.

14. The multilayer semiconductor structure of claim 12 wherein said barrier region includes two layers of undoped AlGaAs separated by an undoped layer of GaAs.

15. The multilayer semiconductor structure of claim 11 wherein said at least two conducting layers includes said uppermost layer of doped GaAs and a lower layer of doped GaAs.

16. The multilayer semiconductor structure of claim 15 wherein said barrier region includes a layer of undoped AlGaAs.

17. The multilayer semiconductor structure of claim 16 wherein said barrier region includes two layers of undoped AlGaAs separated by an undoped layer of GaAs.

18. The multilayer semiconductor structure of claim 11 wherein said barrier region includes a layer of undoped AlAs.

19. The multilayer semiconductor structure of claim 11 wherein said at least two conducting layers includes said uppermost layer of doped GaAs and an intermediate and a lower layer of doped GaAs.

20. The multilayer semiconductor structure of claim 19 wherein said barrier region includes a layer of undoped AlGaAs.

21. The multilayer semiconductor structure of claim 14 wherein said switching means includes means for preventing current flow between said first and second contacts sequentially in said uppermost layer and said lower layer.

22. The multilayer semiconductor structure of claim 21 wherein said means for preventing current flow includes a carrier depletion control means disposed on said exposed surface between said first and second contacts and operable to selectively deplete charge carriers within said conducting layer sequentially.

23. The multilayer semiconductor structure of claim 22 wherein said carrier depletion control means includes a Schottky barrier.

24. The multilayer semiconductor structure of claim 18 wherein said switching means includes means for preventing current flow between said first and second contacts sequentially in said uppermost layer and said lower layer.

25. The multilayer semiconductor structure of claim 18 wherein said means for preventing current flow includes a carrier depletion control means disposed on said exposed surface between said first and second contacts and operable to selectively deplete charge carriers within said conducting layers sequentially.

26. The multilayer semiconductor structure of claim 18 wherein said carrier depletion control means includes a Schottky barrier.

27. The multilayer semiconductor structure of claim 20 wherein said switching means includes means for preventing current flow between said first and second contacts sequentially in said uppermost layer and said lower layer.

28. The multilayer semiconductor structure of claim 20 wherein said means for preventing current flow includes a carrier depletion control means disposed on said exposed surface between said first and second contacts and operable to selectively deplete charge carriers within said conducting layers sequentially.

29. The multilayer semiconductor structure of claim 20 wherein said carrier depletion control means includes a Schottky barrier.

* * * * *